United States Patent
Ohta

[11] 4,282,301
[45] Aug. 4, 1981

[54] PHOTOSENSITIVE DIAZO COATING COMPOSITIONS AND PLATES

[75] Inventor: Takatoshi Ohta, Warabi, Japan

[73] Assignee: Okamoto Chemical Industry Corporation, Japan

[21] Appl. No.: 54,485

[22] Filed: Jul. 3, 1979

Related U.S. Application Data

[63] Continuation-in-part of Ser. No. 969,844, Dec. 15, 1978, abandoned.

[30] Foreign Application Priority Data

Dec. 21, 1977 [JP] Japan .................. 52/154112

[51] Int. Cl.³ .................. G03C 1/60; G03C 1/71
[52] U.S. Cl. .................. 430/175; 430/302; 430/331; 430/157
[58] Field of Search ............ 430/175, 176, 192, 195, 430/908

[56] References Cited

U.S. PATENT DOCUMENTS

| | | | |
|---|---|---|---|
| 3,060,023 | 10/1962 | Burg et al. | 430/254 |
| 3,387,976 | 6/1968 | Sorkin | 430/271 |
| 3,418,295 | 12/1968 | Schoenthaler | 430/285 |
| 3,652,272 | 3/1972 | Thomas | 430/156 |
| 3,732,105 | 5/1973 | Klupfel et al. | 430/175 |
| 3,733,200 | 5/1973 | Takaishi et al. | 430/176 |
| 3,778,270 | 12/1973 | Roos | 430/176 |
| 3,790,382 | 2/1974 | Dahlman | 430/175 |
| 3,841,874 | 10/1974 | Nishino | 430/176 |
| 3,859,099 | 1/1975 | Petropoulos et al. | 430/190 |
| 3,902,906 | 9/1975 | Iwama et al. | 430/190 |
| 4,123,276 | 10/1978 | Kita et al. | 430/175 |

Primary Examiner—Charles L. Bowers, Jr.
Attorney, Agent, or Firm—Wyatt, Gerber, Shoup, Scobey & Badie

[57] ABSTRACT

A photosensitive coating composition for printing plate comprises a mixture containing a copolymer, prepared by polymerizing from 10 to 70% by weight of a monomer (A) having the general formula:

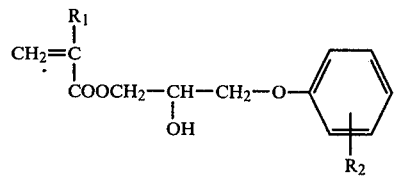

in which $R_1$ and $R_2$ are hydrogen atoms or alkyl groups having 1 or 2 carbon atoms, with from 90 to 30% by weight of at least one monomer (B) selected from the group consisting of methyl methacrylate, methacrylic acid, acrylonitrile, and 2-hydroxyethyl methacrylate together with a diazo resin; and, optionally, a dye; a pigment; and/or other additives.

7 Claims, No Drawings

PHOTOSENSITIVE DIAZO COATING COMPOSITIONS AND PLATES

This application is a continuation-in-part of application Ser. No. 969,844, filed on Dec. 15, 1978, now abandoned.

This invention relates to a photosensitive coating composition, and more specifically to such a composition for use in the preparation of negative printing plates such as are employed in lithography. It pertains also to printing plates prepared from such compositions.

Presensitized plates (hereinafter called "PS plates") of negative type, made of an aluminum sheet of other substrate with a photosensitive coating, are in wide use. In such plates, the photosensitive coating normally contains a diazo resin, a high polymer miscible with the resin. They may also contain one or more dyes, pigments, or other conventional ingredients. A positive image is formed from a negative coating film by irradiation of the film with active rays of light. Such irradiation causes the exposed sections of the photosensitive coating to become less soluble in or less swellable in the develooping solution.

A variety of such compositions have been described, for example, in Japanese Patent Publication Nos. 16157/60, 1167/72, 36961/74, and 6566/76; Japanese Patent Application Disclosure Nos. 30604/75, 36207/75, and 118802/75; and U.S. Pat. Nos. 3,652,272, 3,660,097, and 4,123,276. The high polymers used in the compositions are organic high molecular weight compounds which are insoluble in water and contain such hydrophilic functional groups as hydroxy (—OH), ether (—O—), carboxyl (—COOH), amido (—NHCO—), and urethane (—NHCOO—) groups. The polymers which adhere most strongly to the aluminum sheet are epoxy resins made from epichlorohydrin and bisphenol A. These resins are relatively low molecular weight polymers having functional groups such as hydroxy and phenyl ether groups. However, the image developed from a photosensitive coating containing the epoxy resin, although it exhibits good adhesion to the aluminum sheet, does not withstand the rigors of the printing process very well so that the number of acceptable reproductions which can be made from printing plates coated with such coatings is undesirably low. Acrylic or methacrylic polymer, such as the copolymers composed chiefly of 2 ethyl hydroxymethacrylate as described in U.S. Pat. No. 4,123,270, although widely employed, do not adhere well to the aluminum sheet, nor do they have adequate oil sensitivity because they are somewhat hydrophilic.

A photosensitive coating composition for printing plates has now been discovered comprising a mixture containing a copolymer, prepared by polymerizing from 10 to 70% by weight of a monomer (A) having the general formula:

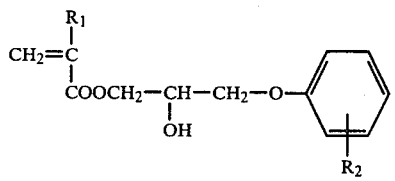

in which $R_1$ and $R_2$ are hydrogen atoms or alkyl groups having 1 or 2 carbon atoms, with from 90 to 30% by weight of at least one monomer (B) selected from the group consisting of methyl methacrylate, methacrylic acid, acrylonitrile, and 2-hydroxyethyl methacrylate; together with a diazo resin, and, optionally, a dye, a pigment, and/or other conventional additives.

Typical examples of monomer (A) within the scope of the above formula are, for example, 2-hydroxy-3-phenoxypropyl acrylate, 2-hydroxy-3-phenoxypropyl methacrylate, 2-hydroxy-3-methylphenoxypropyl acrylate, and 2-hydroxy-3-methylphenoxypropyl methacrylate. These are preferred because of their relative ease of preparation, and because excellent results are achieved with them.

Choice of the monomer (B) depends on the properties of the developing solution to be employed. For example, where a developing solution composed chiefly of an alcoholic organic solvent and an acid is used, methyl methacrylate is very effective. Mixed monomers may also be employed. Where the developer is mostly an aqueous alkali solution, one or more of methyl methacrylate, methacrylic acid, acrylonitrile, 2-hydroxyethyl methacrylate is advantageously used.

In the copolymer of the invention, the suitable proportion of the monomer (A) is in the range from 10 to 70% by weight based on the copolymer. Some variation can be tolerated without adverse results. However, if the proportion is less than 5% by weight, the products produced may not manifest the advantages of the invention. Conversely, 80% or more of the monomer will tend to cause gelation under certain reaction conditions. The preferred range is from 20 to 50% by weight.

The proportion by weight of the monomer or monomers (B) in the copolymer is, as aforesaid, 30 to 90% based on the copolymer. Typically useful copolymers may be prepared to contain the following B-monomers in the percent by weight range indicated.

| 2-Hydroxyethyl methacrylate | 10–70 |
|---|---|
| Methyl methacrylate | |
| Acrylonitrile | 5–40 |
| Methacrylic acid | 2–5 |

Especially preferred copolymers for use with acidic developing solutions composed chiefly of an alcoholic organic solvent and an acid will contain from 20 to 50% by weight of an A-monomer and from 20 to 50% by weight of methyl methacrylate and from zero to 20% by weight of acrylonitrile. For copolymers used with developing solutions composed mostly of an aqueous alkali solution, good results are achieved with copolymers containing from 10-50% by weight of an A-monomer and a mixture of 2.5-5% methacrylic acid, 5-20% acrylonitrile, and 20-50% 2-hydroxyethyl methacrylate, all by weight, as the B-monomers.

Some further improvements may be realized by incorporating small amounts of other olefinic monomers in the copolymer, for example, up to 10% by weight of diacetone acrylamide, butyl vinyl ether, allyl butyrate, styrene, vinyl acetate, monobutyl maleate, maleic acid, or ethyl crotonate.

The copolymers to be used in the present invention are prepared by conventional polymerization methods normally employed for vinyl compounds. Radical, anionic, and cationic polymerizations may be employed. Of these, radical polymerization is preferred. For radical polymerization, the preferred free radical initiators include benzoyl peroxide and azobisisobutyronitrile.

The molecular weight (number average) of the copolymer for use in the invention, as measured by gel permeation chromatography (GPC), is in the range of about 10,000–200,000, preferably about 30,000–60,000, desirably with regular molecular weight distribution.

Solution polymerization is a suitable procedure. Following the polymerization in, for example, dioxane, tetrahydrofuran or other water miscible solvent, the product is purified by washing with water. This removes water soluble oligomers with molecular weights up to about 1000 which are produced as byproducts. The oligomers, if they remain in the product copolymer, adversely affect the shelf life of the resulting photosensitive coating.

Good results are obtained by use of a copolymer whose viscosity as measured, with an original water content of not more than 5 wt%, in a 20 wt% 2-methoxy ethanol solution by a Brookfield rotational viscometer (at 25° C.) ranges from 100 to 1000 c.p.s.

The diazo resins useful for the invention are the conventional diazo resins employed in previously known photosensitizing compositions. They are condensation products of diazoarylamines, e.g., 4-diazodiphenylamine, 4diazo-3-methoxydiphenylamine, and aldehydes, e.g., formaldehyde, paraformaldehyde, and acetaldehyde. Such resins are most desirably used as coupled with an organic sulfonic acid rather than employed alone. Examples of suitable organic sulfonic acids are p-toluenesulfonic acid, dodecylbenzenesulfonic acid, and 2-hydroxy-4-methoxy-benzophenone-5-sulfonic acid, 5-sulfosalicylic acid, and 5-sulfocresotic acid.

These diazo resins may be used singly or as mixtures. Desirable proportions for mixing of the copolymer and the diazo resin are, on the basis of the total weight of the photosensitive coating composition, from 50 to 95% by weight of the copolymer and from 5 to 50% by weight of the resin.

Any of a large variety of conventional dyes or pigments may be employed to color the resulting photosensitive composition. Desirable dyes or pigments are those that will not be dissolved by the developing solution out of the printing areas (the areas hardened by ultraviolet irradiation) during the development of the sensitive coating. Various amounts of such coloring agents, up to about 40% by weight, based on the weight of the composition, may be utilized.

Using the photosensitive coating composition according to the invention, a PS plate is made by first dissolving the components of the composition in a volatile organic solvent such as methanol, methylene chloride, ethyl acetate, 2-methoxy ethanol, and N,N-dimethylformamide. Mixed solvents may be employed. The solution is distributed on a backing material or substrate by an applicator, and then dried.

The substrate may be an aluminum sheet, polished by brushing or balls, chemically polished, or subjected to anodic oxidation after brushing or after electropolishing. Also, a laminated sheet of paper surfaced with aluminum foil, bimetal or trimetal sheet, master paper or other backing material may be employed.

Illustrative examples for the synthesis of typical copolymers for use in the present invention are given below.

SYNTHESIS EXAMPLE 1

Under nitrogen, 0.3 g of azobisisobutyronitrile was added as a polymerization initiator to 150 g of dioxane. The mixture was heated to 80° to 85° C., and the following monomeric mixture was added dropwise:

| | |
|---|---|
| 2-Hydroxy-3-phenoxypropyl acrylate | 50 g |
| Methyl methacrylate | 25 |
| Acrylonitrile | 10 |
| Methacrylic acid | 2 |

After the addition, the whole mixture was stirred for three hours. An additional 150 g of dioxane was added and the resultant solution poured into water to precipitate copolymer (1). The copolymer was redissolved in 2-methoxyethanol and slowly added to water for purification. The product was separated and vacuum dried at 70° C. The viscosity of the product in the form of a 20% by weight 2-methoxyethanol solution was found to be 350 c.p.s. (at 25° C.).

SYNTHESIS EXAMPLE 2

By the same procedure for polymerization as described above, copolymers in varied mixing ratios as given in Table 1 were synthesized.

TABLE 1

| | Copolymer No. | (2) | (3) | (4) |
|---|---|---|---|---|
| Monomers | HPPA | 30g | 20g | 26.5g |
| | MMA | 20 | 20 | 26.5 |
| | HEMA | 20 | 30 | 30.0 |
| | MA | 2 | 2 | 1.5 |
| | AN | 10 | 10 | 20.0 |
| | St | — | 3 | — |
| | DAA | — | 1 | — |
| | MAMB | — | — | — |
| Condition | Dioxane | 150g | 150g | 150g |
| | B.P.O. | — | — | 0.5 |
| | A.I.B.N. | 0.3 | 0.3 | — |
| | Reaction Temp. (°C.) | 85–90 | 85–90 | 100 |
| | Reaction Time (hrs.) | 3 | 3 | 2 |
| | Vis. (at 25° C.) | 500 | 110 | 900 |

Vis.: 2-Methoxy ethanol 20 Wt % (C.P.S.)
B.P.O.: Benzoyl Peroxide (Initiator)
A.I.B.N.: Azobisisobutyronitrile (Initiator)
Monomers
HPPA: 2-Hydroxy-3-Phenoxypropyl Acrylate
MMA: Methyl Methacrylate
HEMA: 2-Hydroxyethyl Methacrylate
MA: Methacrylic Acid
AN: Acrylonitrile
St: Styrene
DAA: Diacetone Acrylamide
MAMB: Maleic Acid Monobutyl Ester

SYNTHESIS EXAMPLE 3

Under the same conditions as used in Synthesis Example 1, the following monomeric mixture was copolymerized:

| | |
|---|---|
| 2-Hydroxy-3(p-methylphenoxypropyl) methacrylate | 50.0 g |
| Methyl methacrylate | 16.5 |
| Acrylonitrile | 30.0 |
| Methacrylic acid | 3.5 |

The viscosity of the copolymer (5) obtained by drying in the same way as described in Example 1 was, in a 20 wt% methoxyethanol solution, 900 c.p.s. (at 25° C.).

The following non-limiting examples are given by way of illustration only.

EXAMPLE 1

In a stream of nitrogen, 0.3 g of azobisisobutyronitrile was added to 150 g of dioxane, the mixture was heated to 80°–85° C., and the following acrylic and methacrylic monomers were added dropwise:

| 2-Hydroxy-3-phenoxypropyl acrylate | 50 g |
|---|---|
| Methyl methacrylate | 50 |

After two hours of uninterrupted stirring, 150 g of dioxane was added and the mixture was added to water to precipitate the copolymer (6). The resulting copolymer was redissolved in 2-methoxyethanol and was slowly added to water for purification. The purified product was dried in vacuum (at 70° C.) and its viscosity with 20% by weight solution of 2-methoxyethanol was determined to be 950 c.p.s. (at 25° C.).

A section of aluminum sheet, grade 2S (Japanese Industrial Standards), was washed with an aqueous solution of 100 g sodium hydroxide and 1 g sodium fluoride at 80° C., and then was anodically oxidized in a sulfuric acid electrolyte for one minute (with a current density of 2 A/dm$^2$ and a voltage of 10 V). The sheet was then thoroughly washed with water, dipped in an aqueous solution of 5% sodium metasilicate (at 70° C.) for 10 seconds, water-washed again, and dried with hot air.

Then, the aluminum sheet was coated with a sensitizer solution of the following composition by a whirler, and dried at 80° C. for 3 minutes, when a photosensitively coated printing plate was obtained.

| Condensate of 4-diazo-3-methoxydiphenyl-amine with paraformaldehyde, coupled with p-toluenesulfonic acid (hereinafter called the "diazo resin A") | 0.2 g |
|---|---|
| Copolymer (6) (20% ethyl acetate solution) | 10.0 |
| "Cinquasia Red-R" (marketed by E. I. DuPont) | 0.4 |
| Methanol | 70.0 |
| 2-Methoxypropanol | 30.0 |

After drying, the weight of the coating was found to be 0.95 g/m$^2$. A negative film was closely attached by vacuum contact to the surface of the photosensitive coating on the sensitive printing plate thus obtained. After one minute of irradiation with ultraviolet rays from a single phase 30 A carbon arc lamp at a distance of 60 cm from the negative surface, the exposed printing plate was dipped in a developing solution of the following composition at a room temperature for 30 seconds, and then washed with water to obtain a printing plate with a developed image.

| Phenylglycol PGH | 10 g |
|---|---|
| Ethanol | 85 |
| γ-Butyrolactic acid | 2 |
| Water | 3 |

This plate, with the image thus developed, was set in a printing machine, and employed for printing. With satisfactorily oiled sensitive printing areas, the plate gave 5,000 finely reproduced copies of the print. The procedure described above was repeated except that an epoxy resin (sold under the trade designation "Epikote 1007" by Shell Chemical Co.) was used in place of the copolymer (6). From about the 2,000th copy and onward, the highlight (150 lines of fine dots) of the image noticeably decreased.

EXAMPLE 2

In the same way as described in Example 1, acrylic and methacrylic monomers as listed below were polymerized to obtain the copolymer (7).

| 2-Hydroxy-3-phenoxypropyl methacrylate | 20 g |
|---|---|
| Methyl methacrylate | 3.5 |
| 2-Hydroxyethyl methacrylate | 30 |
| Acrylonitrile | 10 |

The viscosity of the copolymer with 20% by weight solution of 2-methoxyethanol was determined to be 600 c.p.s. (at 25° C.).

The printing plate used in Example 1 was coated, after the anodic oxidation and treatment with the sodium metasilicate, with a sensitizer solution of the following composition, and then the coated plate was dried (at 80° C. for 3 minutes).

| Condensate of 4-diazo-3-methoxydiphenyl-amine with paraformaldehyde, coupled with dodecylbenzenesulfonic acid | 0.3 g |
|---|---|
| Copolymer (7) (20% 2-methoxyethanol solution) | 10.0 |
| "Oil Blue-603" (marketed by Orient Chemical Ind. Co.) | 0.1 |
| Methanol | 80.0 |
| Methylene chloride | 80.0 |

After the drying, the weight of the coating was found to be 1.15 g/m$^2$. The photosensitive printing plate thus formed was exposed through a negative to light from a source similar to the one used in Example 1 for 30 seconds, dipped in a developing solution of the following composition at a room temperature for 30 seconds, and then washed with water to produce a printing plate with a developed image.

| Aqueous solution of 10% potassium silicate | 20.0 g |
|---|---|
| Phenylethanol | 5.0 |
| Potassium dodecylbenzenesulfonate | 2.0 |
| Potassium sulfate | 0.2 |
| Water | 272.8 |

In a printing operation with this plate set in a printing machine, 6,000 copies of the print with adequately oiled sensitive printing areas were obtained.

COMPARATIVE EXAMPLE 1

For comparison purposes, a well-known copolymer (8) consisting of 2-hydroxyethyl methacrylate (50 wt%), acrylonitrile (20 wt%), methyl methacrylate (26.5 wt%), and methacrylic acid (3.5 wt%), was compared with the copolymers (1) to (4) shown in Synthesis Example 1 and in Table 1 in respect of the printability and other properties.

With each of the copolymers (1) to (4), a sensitizer solution of the following composition was prepared.

| Diazo resin (A) | 0.3 g |
|---|---|
| Copolymer (1), (2), (3) or (4) (20% 2-methoxyethanol solution) | 20.0 |
| "Oil Blue-603" | 0.1 |
| Methylene chloride | 50.0 |
| Methanol | 50.0 |

| | |
|---|---|
| N,N-Dimethylformamide | 5.0 |

Several aluminum plates, grade 2S, were mechanically polished, treated in the manner described in Example 1, and then was anodically oxidized in a sulfuric acid electrolyte. (Conditions: current density=2 A/dm², voltage −10 V, time=one minute). They were dipped in an aqueous solution of 0.5 wt% sodium metasilicate, washed with water, and dried. Each plate was coated with sensitizer solution by means of a lateral whirler at a speed of 80 r.p.m., and dried. Each of the printing plates thus prepared was exposed to the light source of Example 1 through Kodak Step Tablet No. 2, and then was processed with a developing solution of the following composition (at a solution temperature between 20° and 35° C.).

| | |
|---|---|
| Aqueous solution of 40% sodium silicate | 5 g |
| Sodium diisopropyl naphthalene sulfonate | 2 |
| Potassium sulfite | 1 |
| DL-α-phenylethyl alcohol | 5 |
| Water | 237 |

After the development, each printing plate was further coated by rubbing with a nonsensitizer solution, "Western A.G.E." marketed by Western Lithograph Co., set in a printing machine, and the printing areas of the plate were inked by an ink roller for testing. In this test, the number of inked steps of the tablet after the initial revolution of the roller was compared with that after one hundred revolutions of the roller. When the printing areas are swollen with the developing solution, the difference between the numbers of steps will increase. The test results, as summarized in Table 2, clearly show that the photosensitive coatings according to the present invention have good ink absorbency, namely good oil sensitivity.

TABLE 2

| | Developing conditions | | | | | |
|---|---|---|---|---|---|---|
| | 20° C.-30 sec. | | 25° C.-1 min. | | 35° C.-2 min. | |
| Copolymer | Initial revoln. | 100 revoln. | Initial revoln. | 100 revoln. | Initial revoln. | 100 revoln. |
| (1) | 10.5 | 10.5 | 10 | 9 | 9 | 8 |
| (2) | 10.5 | 10 | 10 | 9 | 9 | 8 |
| (3) | 9 | 8 | 9 | 8 | 9 | 7 |
| (4) | 7 | 7 | 6.5 | 6 | 6 | 4.5 |
| (8)* | 9 | 8 | 9 | 7 | 9 | 6 |

*A commercially available copolymer for comparison use.

The new photosensitive plate of the present invention is formed of the photosensitive coating composition thereof and the coated amount of said photosensitive coating composition is usually 0.85 g/m²–2.5 g/m², and preferably, 0.95 g/m²–1.5 g/m².

What is claimed is:

1. A photosensitive coating composition for negative printing plates, comprising a mixture containing from 50% to 95% by weight of a copolymer, prepared by polymerizing from 10 to 70% by weight of a monomer (A) having the general formula:

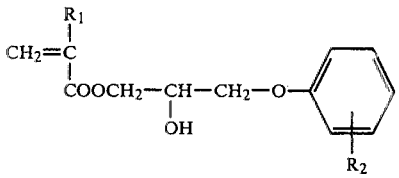

in which $R_1$ and $R_2$ are hydrogen atoms or alkyl groups having 1 or 2 carbon atoms, with from 30 to 90% by weight of at least one monomer (B) selected from the group consisting of methyl methacrylate, methacrylic acid, acrylonitrile, and 2-hydroxylethyl methacrylate; in admixture with from 5% to 50% by weight of a diazo resin which is a condensation product of a diazoarylamine and an aldehyde.

2. A photosensitive coating composition of claim 1 additionally containing up to 40% by weight of a dye or pigment.

3. A photosensitive coating composition of claim 1, in which said monomer (A) is at least one monomer selected from the group consisting of 2-hydroxy-3-phenoxypropyl acrylate, 2-hydroxy-3-phenoxy-propyl methacrylate, 2-hydroxy-3-methylphenoxypropyl acrylate, and 2-hydroxy-3-methylphenoxypropyl methacrylate.

4. A photosensitive coating composition of claim 1, in which the viscosity of the copolymer is from 100 to 1000 c.p.s. measured in a 20 wt% 2-methoxy ethanol solution at 25° C.

5. A photosensitive coating composition of claim 1, in which said diazo resin is at least one condensation product selected from the group consisting of the condensation products of 4-diazodiphenylamine or 4-diazo-3-methoxydiphenylamine and formaldehyde, paraformaldehyde, or acetaldehyde, coupled with an organic sulfonic acid.

6. A coating composition of claim 5, in which said organic sulfonic acid is at least one of the acids selected from the group consisting of p-toulenesulfonic acid, dodecylbenzenesulfonic acid, 2-hydroxy-4-methoxybenzophenone-5-sulfonic acid, 5-sulfosalicylic acid, and 5-sulfocresotic acid.

7. A photosensitive plate comprising a photosensitive coating composition as defined in claim 1, 2, 3, 4, 5 or 6 applied to a base plate uniformly in amounts of 0.85 g/m²–2.5 g/m².

* * * * *